(12) United States Patent
Irobe

(10) Patent No.: US 12,317,676 B2
(45) Date of Patent: May 27, 2025

(54) ELECTRO-OPTICAL DEVICE AND ELECTRONIC APPARATUS

(71) Applicant: SEIKO EPSON CORPORATION, Tokyo (JP)

(72) Inventor: Jun Irobe, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 761 days.

(21) Appl. No.: 17/461,985

(22) Filed: Aug. 30, 2021

(65) Prior Publication Data

US 2022/0069257 A1 Mar. 3, 2022

(30) Foreign Application Priority Data

Aug. 31, 2020 (JP) ................. 2020-145743

(51) Int. Cl.
*H10K 59/80* (2023.01)
*H10K 50/856* (2023.01)
*H10K 50/858* (2023.01)
*H10K 59/30* (2023.01)
*H10K 59/38* (2023.01)
*H10K 102/00* (2023.01)
*H10K 50/852* (2023.01)

(52) U.S. Cl.
CPC ......... *H10K 50/858* (2023.02); *H10K 50/856* (2023.02); *H10K 59/876* (2023.02); *H10K 59/878* (2023.02); *H10K 59/879* (2023.02); *H10K 50/852* (2023.02); *H10K 59/30* (2023.02); *H10K 59/38* (2023.02); *H10K 2102/3026* (2023.02)

(58) Field of Classification Search
None
See application file for complete search history.

(56) References Cited

U.S. PATENT DOCUMENTS

2006/0192471 A1\* 8/2006 Inoue ................... H10K 50/852
428/917
2007/0069996 A1 3/2007 Kuba et al.
(Continued)

FOREIGN PATENT DOCUMENTS

JP 2007115679 5/2007
JP 2009170127 7/2009
(Continued)

*Primary Examiner* — Joseph C. Nicely
*Assistant Examiner* — E. Rhett Cheek
(74) *Attorney, Agent, or Firm* — JCIPRNET

(57) ABSTRACT

An electro-optical device including a semi-transmissive reflective layer having light-light-reflectivity and light-transparency, a reflective layer disposed between the substrate and the semi-transmissive reflective layer, a light-emitting layer disposed between the reflective layer and the semi-transmissive reflective layer, and a lens that is disposed corresponding to a pixel, and on which light emitted from the light-emitting layer is incident, is provided. The electro-optical device satisfies the following (Formula 1) below, where an optical distance between the reflective layer and the semi-transmissive reflective layer is L0, a peak wavelength of a light emission spectrum of the light-emitting layer is λ, and a natural number is m.

$$L0 > (m+\tfrac{1}{2})\lambda/2 \qquad \text{(Formula 1)}$$

5 Claims, 12 Drawing Sheets

(56) References Cited

U.S. PATENT DOCUMENTS

| | | |
|---|---|---|
| 2009/0079336 A1 | 3/2009 | Yamada et al. |
| 2009/0179563 A1 | 7/2009 | Jun |
| 2011/0163339 A1* | 7/2011 | Negishi ............... H10K 50/856 977/755 |
| 2012/0081892 A1* | 4/2012 | Kubota ............... G02B 27/017 362/296.01 |
| 2012/0133575 A1 | 5/2012 | Hasegawa |
| 2014/0295597 A1* | 10/2014 | Sato ..................... H10K 71/00 438/29 |
| 2015/0084026 A1 | 3/2015 | Miyamoto et al. |
| 2015/0243932 A1* | 8/2015 | Shiratori ............. H10K 59/871 257/88 |
| 2015/0333108 A1 | 11/2015 | Miyamoto et al. |
| 2018/0076267 A1* | 3/2018 | Song .................... H10K 59/122 |
| 2019/0319219 A1* | 10/2019 | Kitahara ............. H10K 50/852 |
| 2020/0035937 A1* | 1/2020 | Wu ....................... H10K 59/35 |
| 2021/0005688 A1* | 1/2021 | Shinya ..................... G09F 9/00 |
| 2021/0013419 A1* | 1/2021 | Ogita ..................... C09K 11/06 |
| 2021/0143367 A1* | 5/2021 | Ichikawa ............. H10K 59/121 |
| 2022/0302418 A1* | 9/2022 | Liu ....................... H10K 50/13 |

FOREIGN PATENT DOCUMENTS

| | | |
|---|---|---|
| JP | 2010034074 | 2/2010 |
| JP | 2012134128 | 7/2012 |
| JP | 2012243714 | 12/2012 |
| JP | 2015069700 | 4/2015 |

* cited by examiner

ELECTRO-OPTICAL DEVICE AND ELECTRONIC APPARATUS

The present application is based on, and claims priority from JP Application Serial Number 2020-145743, filed Aug. 31, 2020, the disclosure of which is hereby incorporated by reference herein in its entirety.

BACKGROUND

1. Technical Field

The present disclosure relates to an electro-optical device and an electronic apparatus.

2. Related Art

An electro-optical device such as a display device including a light-emitting element such as an organic EL (electroluminescence) element, or the like has been known.

A display device described in JP 2010-34074 A includes a light-emitting element. The light-emitting element includes a first electrode, an organic layer including a light-emitting layer, and a second electrode. The first electrode, the organic layer, and the second electrode are disposed in this order. Further, in the display device, light resonance structure is provided that resonates light emitted by the light-emitting layer, between an interface between the first electrode and the organic layer, and an interface between the second electrode and the organic layer.

Further, the display device includes a lens section and a transparent upper substrate. The lens section is disposed between the light-emitting element and the transparent upper substrate. Light emitted from the light-emitting layer through the second electrode passes through the lens section. In this display device, total reflection at an interface between the transparent upper substrate and the air is caused by the lens section, and an optical path of light that cannot be emitted into air is bent, to improve light extraction efficiency.

Generally, a resonant condition of the light resonance structure is set so that intensity of light is maximized when a display surface of the display device is viewed from a normal line direction, that is, when a visual field angle is 0°. Specifically, when viewed from the normal line direction, an optical distance of the light resonance structure is set so that a peak wavelength of light emitted in the normal line direction from the light-emitting element is resonated. However, adopting such light resonance structure maximizes intensity of light in the normal line direction, and therefore, even when the lens section is provided, an effect of improving the light extraction efficiency by the lens section is not sufficiently obtained.

SUMMARY

An aspect of an electro-optical device according to the present disclosure includes a semi-transmissive reflective layer having light-reflectivity and light-transparency, a reflective layer disposed between the substrate and the semi-transmissive reflective layer, a light-emitting layer disposed between the reflective layer and the semi-transmissive reflective layer, and a lens that is disposed corresponding to a pixel, and on which light emitted from the light-emitting layer is incident, wherein an optical distance $L0$ between the reflective layer and the semi-transmissive reflective layer satisfies (Formula 1) below, where a peak wavelength of a light emission spectrum of the light-emitting layer is $\lambda$, and a natural number is $m$.

$$L0 > (m+\tfrac{1}{2})\lambda/2 \qquad \text{(Formula 1)}$$

An aspect of an electro-optical device according to the present disclosure includes a substrate, a semi-transmissive reflective layer having light-reflectivity and light-transparency, a reflective layer disposed between the substrate and the semi-transmissive reflective layer, a light-emitting layer disposed between the reflective layer and the semi-transmissive reflective layer, and a lens that is disposed corresponding to a pixel, and on which light emitted from the light-emitting layer is incident, wherein a first light passing through the semi-transmissive reflective layer, and traveling in a direction inclined with respect to a normal direction of the substrate has intensity greater than that of a second light passing through the semi-transmissive reflective layer, and has traveling in the normal direction of the substrate.

An aspect of an electronic apparatus according to the present disclosure includes the above-described electro-optical device and a control unit configured to control operation of the electro-optical device.

DESCRIPTION OF EXEMPLARY EMBODIMENTS

Figure 1:
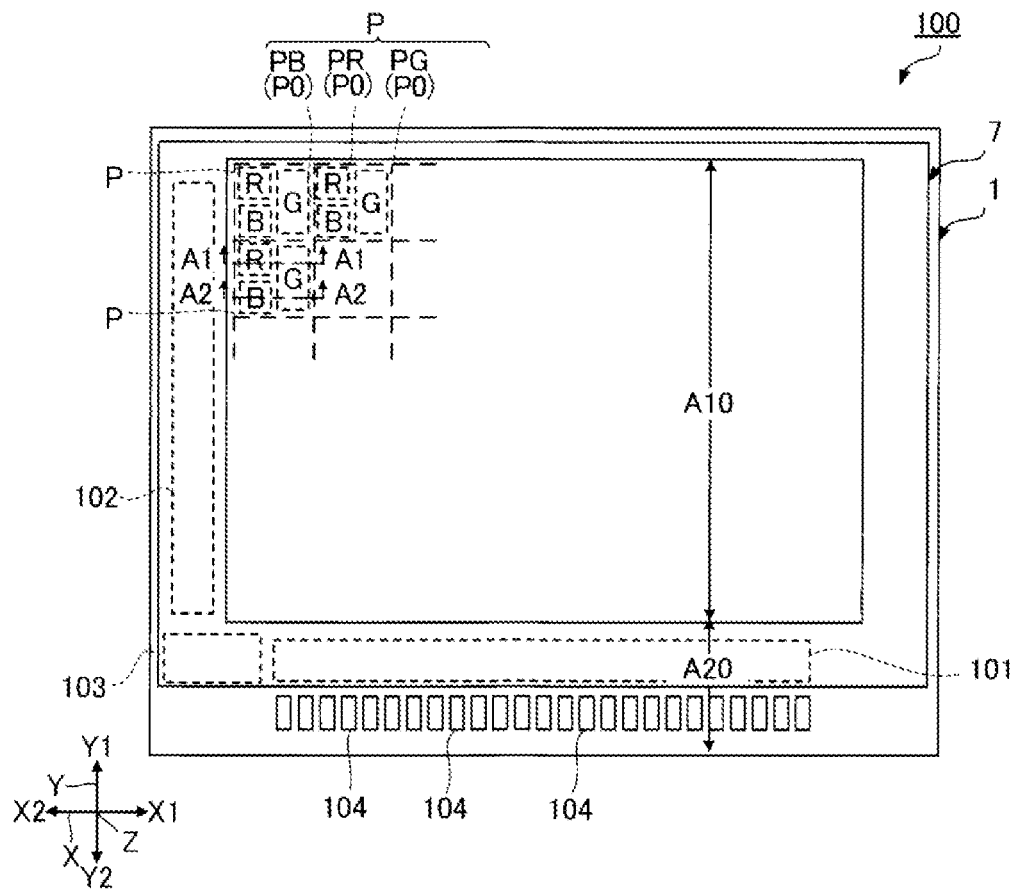
FIG. 1 is a plan view schematically illustrating an electro-optical device according to a first exemplary embodiment.

Preferred exemplary embodiments of the present disclosure will be described below with reference to the accompanying drawings. Note that, in the drawings, dimensions and scales of sections are differed from actual dimensions and scales as appropriate, and some of the sections are schematically illustrated to make them easily recognizable. Further, the scope of the present disclosure is not limited to these embodiments unless otherwise stated to limit the present disclosure in the following descriptions.

1. Electro-Optical Device 100

1A. First Exemplary Embodiment

1A-1. Overall Configuration of Electro-Optical Device 100

FIG. 1 is a plan view schematically illustrating an electro-optical device 100 according to a first exemplary embodiment. Note that, for convenience of explanation, the description will be made appropriately using an X-axis, a Y-axis, and a Z-axis orthogonal to each other. Further, a direction along the X-axis is defined as an X1 direction, and a direction opposite the X1 direction is defined as an X2 direction. Similarly, a direction along the Y-axis is defined as a Y1 direction, and a direction opposite the Y1 direction is defined as a Y2 direction. A direction along the Z-axis is defined as a Z1 direction, and a direction opposite the Z1 direction is defined as a Z2 direction. Viewing the electro-optical device 100 from the Z1 direction or the Z2 direction is referred to as "in plan view".

The electro-optical device 100 illustrated in FIG. 1 is a device for displaying a full color image using organic EL (electroluminescence). Note that, images include one that displays only character information. The electro-optical device 100 is a micro display suitably used in a head-mounted display, or the like, for example.

The electro-optical device 100 includes a display area A10 in which an image is displayed, and a peripheral area A20 surrounding the display area A10 in plan view. In the example illustrated in FIG. 1, a shape of the display area A10 in plan view is quadrangular, but is not limited thereto, and may be other shapes.

The display area A10 has a plurality of pixels P. Each pixel P is a smallest unit in image display. In the present exemplary embodiment, the plurality of pixels P are disposed in a matrix in the X1 direction and the Y2 direction. Each pixel P has a sub-pixel PR from which light in a red wavelength region is obtained, a sub-pixel PB from which light in a blue wavelength region is obtained, and a sub-pixel PG from which light in a green wavelength region is obtained. One pixel P of a color image is constituted by the sub-pixel PB, the sub-pixel PG, and the sub-pixel PR. In the following, when the sub-pixel PB, the sub-pixel PG, and the sub-pixel PR are not differentiated, notation of a sub-pixel P0 is used.

The blue wavelength region is a wavelength region that is shorter than the green wavelength region, and the green wavelength region is a wavelength region that is shorter than the red wavelength region. The red wavelength region is greater than 580 nm and 700 nm or less. The green wavelength region is from 500 nm to 580 nm. The blue wavelength region is 400 nm or greater and less than 500 nm.

The three sub-pixels P0 of the sub-pixels PB, PR, and PG are provided for each pixel P. The sub-pixel P0 is an element that constitutes the pixel P. The sub-pixel P0 is a minimum unit independently controlled. In the present exemplary embodiment, an array of the sub-pixels P0 is a rectangular array. In the present exemplary embodiment, an area of the sub-pixel PG among the three sub-pixels P0 included in the pixel P is the greatest. Note that, an area of the sub-pixel PB or PR may be the greatest.

The electro-optical device 100 includes an element substrate 1, and a transmissive substrate 7 having light-transparency. The electro-optical device 100 has so-called top-emission structure, and emits light through the transmissive substrate 7. Note that, a direction in which the element substrate 1 and the transmissive substrate 7 overlap matches the Z1 direction or the Z2 direction. Further, the "light-transparency" refers to transparency to visible light, and means that transmittance of visible light may be greater than or equal to 50%.

The element substrate 1 includes a data line driving circuit 101, a scanning line drive circuit 102, a control circuit 103, and a plurality of external terminals 104. The data line driving circuit 101, the scanning line drive circuit 102, the control circuit 103, and the plurality of external terminals 104 are disposed in the peripheral area A20. The data line driving circuit 101 and the scanning line drive circuit 102 are peripheral circuits that control driving of portions constituting the plurality of sub-pixels P0. The control circuit 103 controls image display. Image data is supplied to the control circuit 103 from an upper circuit (not illustrated). The control circuit 103 supplies various signals based on the image data to the data line driving circuit 101 and the scanning line drive circuit 102. Although not illustrated, a flexible printed circuits (FPC) substrate for electrical coupling with the upper circuit or the like is coupled to the external terminal 104. Further, the element substrate 1 is electrically coupled to a power supply circuit (not illustrated).

The transmissive substrate 7 is a counter substrate that protects a light-emitting unit 2 and a colored layer 5 described below included in the element substrate 1. The transmissive substrate 7 is formed of, for example, a glass substrate or a quartz substrate.

Figure 2:
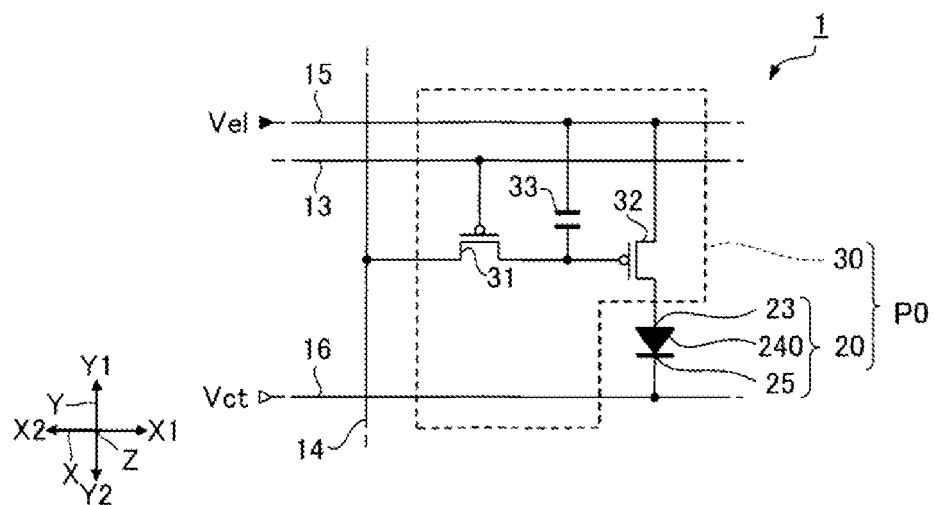
FIG. 2 is an equivalent circuit diagram of a sub-pixel and the like illustrated in FIG. 1.

FIG. 2 is an equivalent circuit diagram of the sub-pixel P0 illustrated in FIG. 1. The element substrate 1 is provided with a plurality of scanning lines 13, a plurality of data lines 14, a plurality of power supply lines 15, and a plurality of power supplying lines 16. In FIG. 2, one sub-pixel P0 and elements corresponding thereto are representatively illustrated.

The scanning line 13 extends in the X1 direction, and the data line 14 extends in the Y1 direction. Note that, although not illustrated, the plurality of scanning lines 13 and the plurality of data lines 14 are arrayed in a lattice. Further, the scanning line 13 is coupled to the scanning line drive circuit 102 illustrated in FIG. 1, and the data line 14 is coupled to the data line driving circuit 101 illustrated in FIG. 1.

As illustrated in FIG. 2, the sub-pixel P0 includes a light-emitting element 20, and a pixel circuit 30 that controls driving of the light-emitting element 20. The light-emitting element 20 is constituted of an organic light-emitting diode (OLED). The light-emitting element 20 includes a pixel electrode 23, a common electrode 25, and a light-emitting layer 240.

The power supplying line 15 is electrically coupled to the pixel electrode 23 via the pixel circuit 30. On the other hand, the power supplying line 16 is electrically coupled to the common electrode 25. Here, a power supply potential Vel on a high potential side is supplied from a power supply circuit (not illustrated) to the power supplying line 15. A power supply potential Vct on a low potential side is supplied from the power supply circuit (not illustrated) to the power supplying line 16. The pixel electrode 23 functions as an anode, and the common electrode 25 functions as a cathode. In the light-emitting element 20, the light-emitting layer 240 emits light, when holes supplied from the pixel electrode 23 and electrons supplied from the common electrode 25 are recoupled in the light-emitting layer 240. Note that, the pixel electrode 23 is provided for each sub-pixel P0, and the pixel electrode 23 is controlled independently from the other pixel electrodes 23.

The pixel circuit 30 includes a switching transistor 31, a driving transistor 32, and a retention capacitor 33. A gate of the switching transistor 31 is electrically coupled to the scanning line 13. Further, one of a source and a drain of the switching transistor 31 is electrically coupled to the data line 14, and the other is electrically coupled to a gate of the driving transistor 32. Further, one of a source and a drain of the driving transistor 32 is electrically coupled to the power supplying line 15, and the other is electrically coupled to the pixel electrode 23. Further, one of electrodes of the retention capacitor 33 is coupled to the gate of the driving transistor 32, and the other electrode is coupled to the power supplying line 15.

In the pixel circuit 30 described above, when the scanning line 13 is selected by activating a scanning signal by the scanning line drive circuit 102, the switching transistor 31 provided in the selected sub-pixel P0 is turned on. Then, the data signal is supplied from the data line 14 to the driving transistor 32 corresponding to the selected scanning line 13. The driving transistor 32 supplies a current corresponding to a potential of the supplied data signal, that is, a current corresponding to a potential difference between the gate and the source, to the light-emitting element 20. Then, the light-emitting element 20 emits light at a luminance corresponding to a magnitude of the current supplied from the driving transistor 32. Further, when the scanning line drive circuit 102 releases the selection of the scanning line 13 and the switching transistor 31 is turned off, the potential of the gate of the driving transistor 32 is held by the retention capacitor 33. Thus, the light-emitting element 20 can maintain light emission of the light-emitting element 20 even after the switching transistor 31 is turned off.

Note that the configuration of the pixel circuit 30 described above is not limited to the illustrated configuration. For example, the pixel circuit 30 may further include a transistor that controls conduction between the pixel electrode 23 and the driving transistor 32.

1A-2. Element Substrate 1

Figure 3:
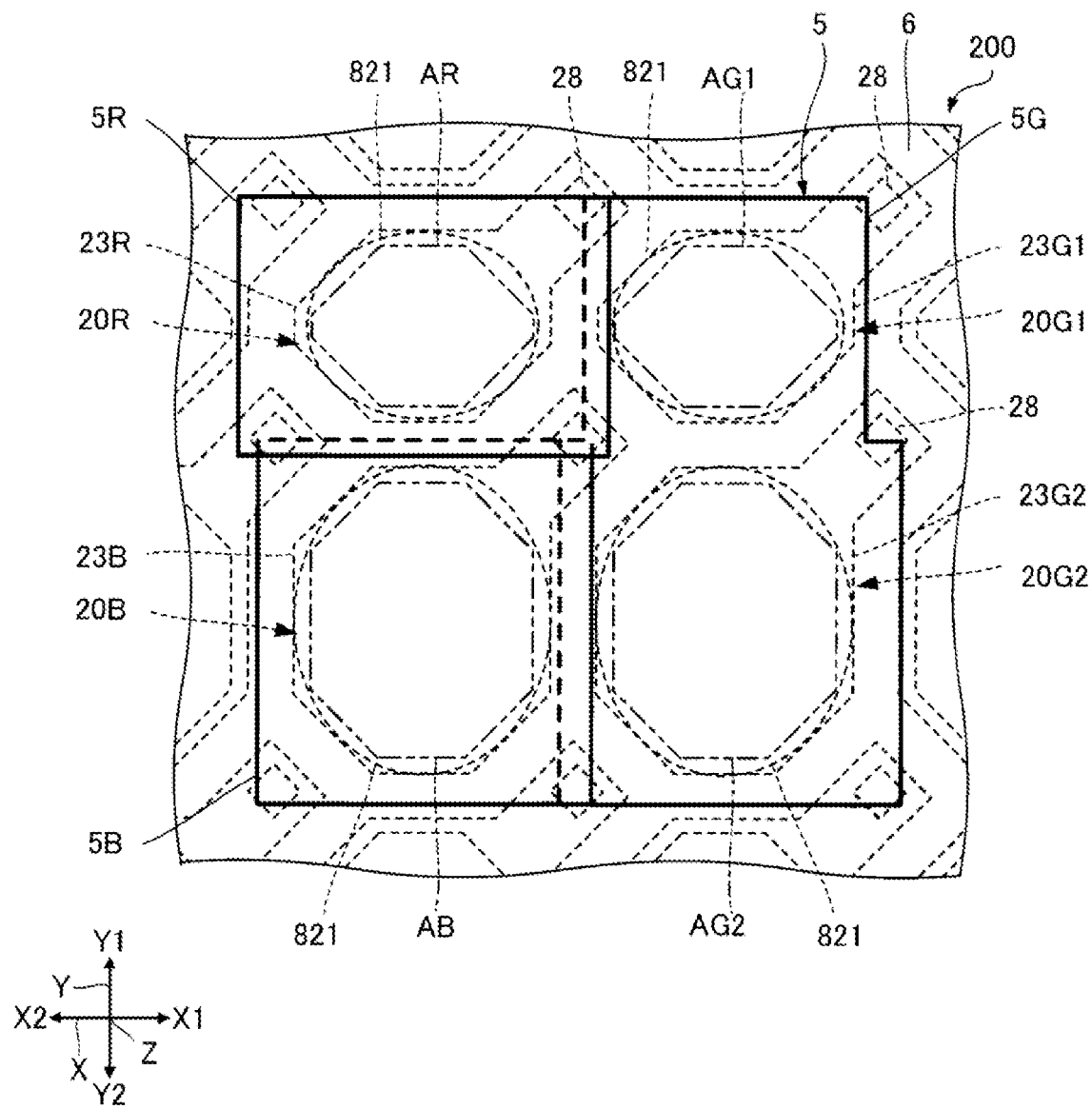
FIG. 3 is a plan view illustrating a part of an element substrate.

FIG. 3 is a plan view illustrating a part of the element substrate 1 illustrated in FIG. 1. In FIG. 3, elements of one pixel P are representatively illustrated. In the following, "R" is added to an end of a sign of an element associated with the sub-pixel PR, "G" is added to an end of a sign of an element associated with the sub-pixel PG, and "B" is added to an end of a sign of an element associated with the sub-pixel PB.

Note that, when light emission colors are not distinguished from each other, each of "B", "G", and "R" at the end of the sign is omitted.

As illustrated in FIG. 3, the element substrate 1 has a set of light-emitting elements 20R, 20B, 20G1, and 20G2 for each pixel P. The light-emitting element 20R is the light-emitting element 20 provided in the sub-pixel PR. The light-emitting element 20B is the light-emitting element 20 provided in the sub-pixel PB. Each of the light-emitting elements 20G1 and 20G2 is the light-emitting element 20 provided in the sub-pixel PG.

The light-emitting elements 20G1 and 20G2 share one pixel circuit 30 for each sub-pixel PG. Accordingly, the light-emitting elements 20G1 and 20G may be considered as one light-emitting element 20G.

The light-emitting element 20R has a light-emitting region AR that emits light in a wavelength region including the red wavelength region. The light-emitting element 20B has a light-emitting region AB that emits light in a wavelength region including the blue wavelength region. The light-emitting element 20G1 has a light-emitting region AG1 that emits light in a wavelength region including the green wavelength region. The light-emitting element 20G2 has a light-emitting region AG2 that emits light in a wavelength region including the green wavelength region.

In addition, in the example illustrated in FIG. 3, a shape of each of the light-emitting regions AR, AG1, AG2, and AB in plan view is octagonal. An area of each of the light-emitting regions AR and AB is less than a total area of the light-emitting regions AG1 and AG2. The "area" refers to an area in plan view. Note that, the shapes of the respective light-emitting regions AR, AG1, AG2, and AB in plan view may be different from each other or may be equal to each other.

Figure 4:
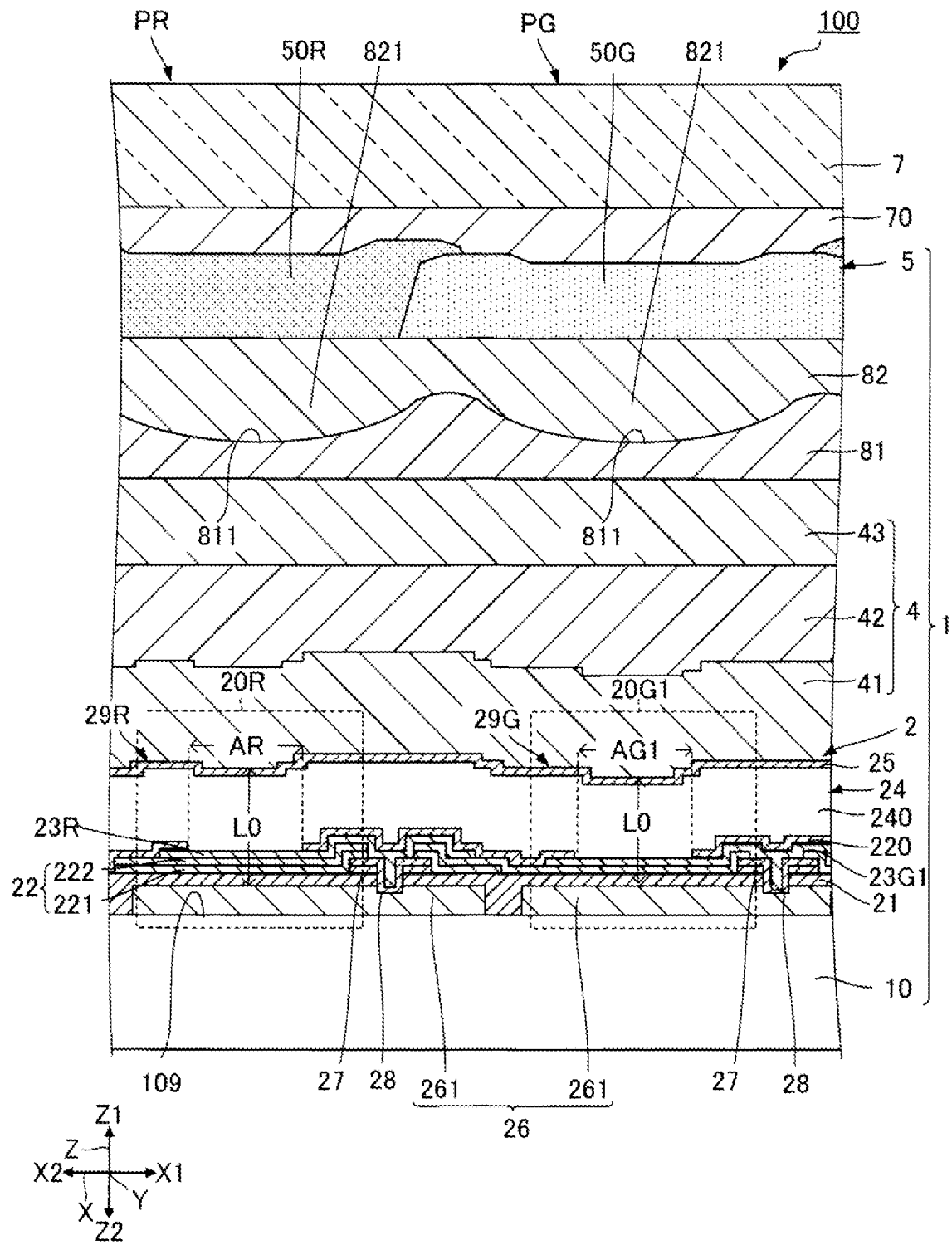
FIG. 4 is a cross-sectional view of the electro-optical device illustrated in FIG. 1.
Figure 5:
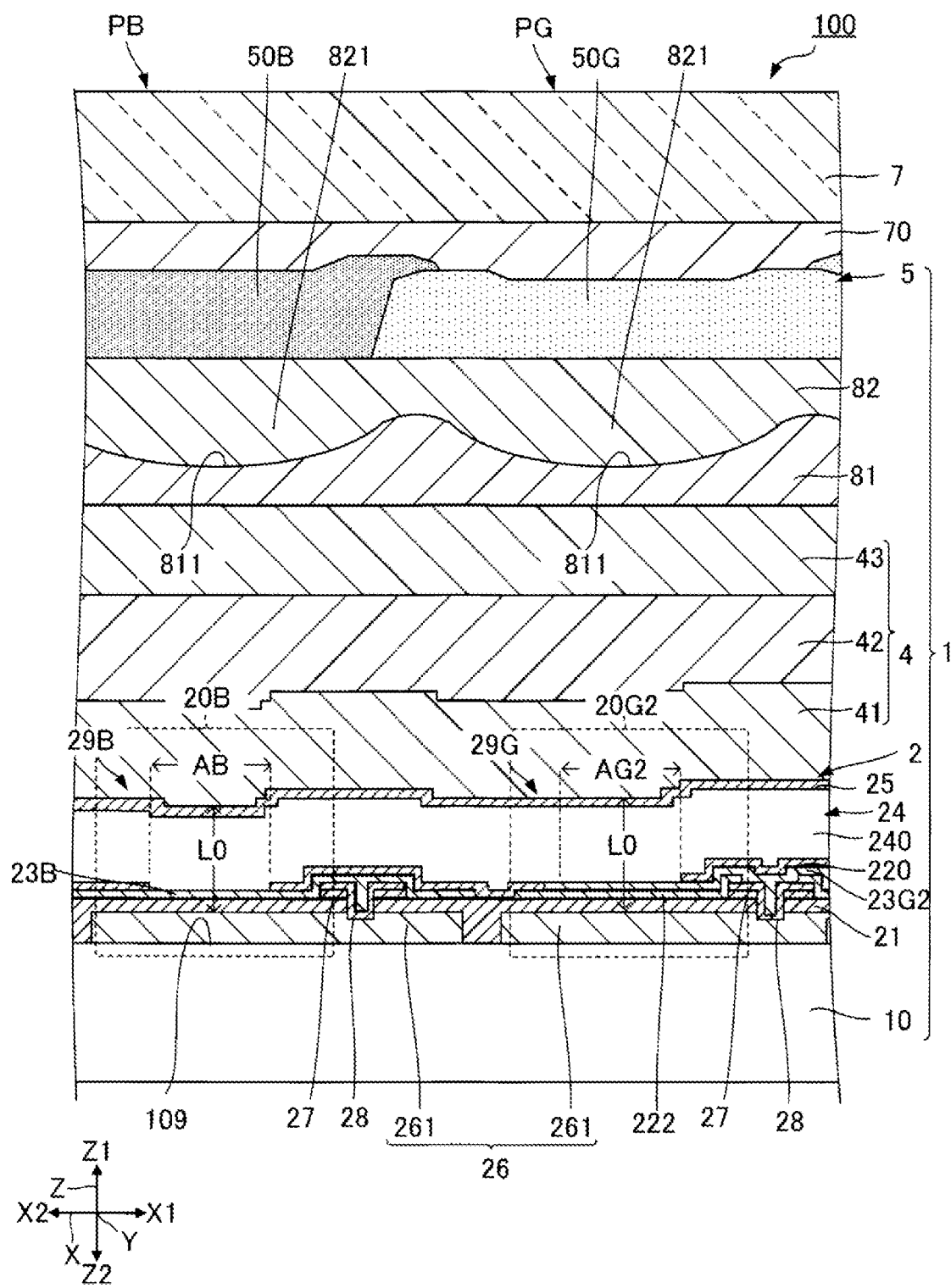
FIG. 5 is a cross-sectional view of the electro-optical device illustrated in FIG. 1.

Each of FIG. 4 and FIG. 5 is a cross-sectional view of the electro-optical device 100 in FIG. 1. FIG. 4 corresponds to a cross-section of the sub-pixels PR and PG, and FIG. 5 corresponds to a cross-section of the sub-pixels PB and PG. That is, FIG. 4 corresponds to an A-1-A1 cross-section in FIG. 1, and FIG. 5 corresponds to a cross-section taken along a line A2-A2 in FIG. 1.

As illustrated in FIG. 4 and FIG. 5, the element substrate 1 includes the substrate 10, the light-emitting unit 2, a sealing layer 4, a first layer 81, a second layer 82, and the colored layer 5. Further, the light-emitting unit 2 includes the plurality of light-emitting elements 20 described above. Note that, the light-transmitting substrate 7 described above is bonded to the element substrate 1 by an adhesive layer 70.

Although not illustrated in detail, the substrate 10 is a wiring substrate where the pixel circuit 30 described above is formed at a silicon substrate, for example. Note that, instead of a silicon substrate, a glass substrate, a resin substrate, or a ceramic substrate may be used, for example. Moreover, although not illustrated in detail, each of the above-described transistors included in the pixel circuit 30 may be any of an MOS transistor, a thin film transistor, and a field effect transistor. When the transistor included in the pixel circuit 30 is an MOS transistor having an active layer, the active layer may be formed of a silicon substrate. Further, examples of a material of each of the elements and the wiring lines included in the pixel circuit 30 include conductive materials such as polysilicon, metal, metal silicide, and a metallic compound, for example. Additionally, the substrate 10 has a main surface 109 on a second sealing layer 42 side. A normal line direction of the main surface 109 of the substrate 10 is parallel to the Z1 direction. In addition, the main surface 109 of the substrate 10 is parallel to an upper surface of the transmissive substrate 7, which is a display surface of the electro-optical device 100.

The light-emitting unit 2 is disposed on the substrate 10. The light-emitting unit 2 includes a reflective layer 26, an insulating layer 21, a light-transmitting layer 22, an element separation layer 220, a plurality of the pixel electrodes 23, an organic layer 24, and the common electrode 25. The plurality of pixel electrodes 23 are light-transmitting layers, and the common electrode 25 is a semi-transmissive reflective layer. In the light-emitting unit 2, the plurality of light-emitting elements 20 described above are formed of the above elements. Note that, the organic layer 24 and the common electrode 25 are shared by the plurality of light-emitting elements 20. Further, the organic layer 24 has the light-emitting layer 240 described above.

The reflective layer 26 is disposed between the substrate 10 and the common electrode 25. The reflective layer 26 includes a plurality of reflective sections 261 having light light-reflectivity. The "light light-reflectivity" refers to light-reflectivity to visible light, and means that a reflectance of visible light may be greater than or equal to 50%. Each reflective section 261 reflects light emitted by the light-emitting layer 240. Note that, although not illustrated, the plurality of reflective sections 261 are disposed corresponding to the plurality of sub-pixels P0 in plan view. Examples of a material of the reflective layer 26 include metal such as Al (aluminum), Cu (copper), and Ag (silver), or alloy of the above metal. Note that, the reflective layer 26 may function as a wiring line that is electrically coupled to the pixel circuit 30. Also, although not illustrated, a high reflective film having light-transparency and insulating properties for enhancing light light-reflectivity of the reflective layer 26 may be disposed between the reflective layer 26 and the insulating layer 21. The high reflective film is, for example, a silicon oxide film.

The insulating layer 21 is disposed on the reflective layer 26, and fills gaps among the plurality of reflective sections 261 included in the reflective layer 26. The insulating layer 21 is formed of, for example, a silicon nitride (SiN) film. Note that, although not illustrated in detail, the insulating layer 21 is, for example, a laminate of a plurality of layers.

A plurality of contact electrodes 28 are disposed on the insulating layer 21. The contact electrode 28 is provided for each light-emitting element 20. The contact electrode 28 electrically couples the pixel circuit 30 and the pixel electrode 23. Note that, an insulating portion 27 formed of an insulating material such as silicon oxide is provided between the contact electrode 28 and the insulating layer 21. Additionally, a material of the contact electrode 28 is, for example, a conductive material such as tungsten (W), titanium (Ti), or titanium nitride (TiN).

The light-transmitting layer 22 is disposed on the insulating layer 21. The light-transmitting layer 22 is formed of a plurality of films having insulating properties. Specifically, the light-transmitting layer 22 includes a first insulating film 221 and a second insulating film 222. The first insulating film 221 is disposed in the sub-pixel PR, and is not disposed in the sub-pixels PB and PG. The second insulating film 222 is disposed on the first insulating film 221. The second insulating film 222 is disposed in the sub-pixels PR and PG, and is not disposed in the sub-pixel PB. Examples of a material of the light-transmitting layer 22 include, for example, silicon-based inorganic materials such as silicon oxide and silicon nitride.

The plurality of pixel electrodes 23 are disposed on the light-transmitting layer 22. The pixel electrode 23 is provided for each light-emitting element 20. Although not illustrated, each pixel electrode 23 overlaps the corresponding reflective section 261 in plan view. Each pixel electrode 23 is a transparent electrode having light-transparency and electrical conductivity. Examples of a material of the pixel electrode 23 include a transparent conductive material such as Indium Tin Oxide (ITO) or Indium Zinc Oxide (IZO). Note that, the pixel electrode 23R is the pixel electrode 23 provided in the sub-pixel PR. The pixel electrodes 23G1 and 23G2 are the pixel electrodes 23 provided in the sub-pixel PG. The pixel electrodes 23G1 and 23G2 may be formed separately or may be integrally formed. The pixel electrode 23B is the pixel electrode 23 provided in the sub-pixel PB.

Further, the element separation layer 220 having a plurality of openings is disposed on the light-transmitting layer 22. The element separation layer 220 covers an outer edge of each of the plurality of pixel electrodes 23. The element separation layer 220 electrically insulates the plurality of pixel electrodes 23 from each other. A plurality of the light-emitting regions A are defined by the plurality of openings included in the element separation layer 220. Furthermore, the light-emitting region A can be defined as a region where the organic layer 24 and the pixel electrode 23 come into contact. Specifically, the light-emitting region AR, the light-emitting region AG1, the light-emitting region AG2, and the light-emitting region AB are defined. Examples of a material of the element separation layer 220 include, for example, silicon-based inorganic materials such as silicon oxide and silicon nitride.

The organic layer 24 is disposed on the plurality of pixel electrodes 23. The organic layer 24 is disposed between the reflective layer 26 and the common electrode 25. The organic layer 24 includes the light-emitting layer 240 that includes an organic light-emitting material. The organic light-emitting material is a light-emitting organic compound. Further, in addition to the light-emitting layer 240, the organic layer 24 includes, for example, a hole injecting layer, a hole transport layer, an electron transport layer, an electron injecting layer, and the like. The organic layer 24 includes the light-emitting layer 240 for obtaining light emission colors of blue, green, and red to achieve white light emission. Note that, the configuration of the organic layer 24 is not particularly limited to the above configuration, and a known configuration can be applied thereto.

The common electrode 25 is disposed on the organic layer 24. The common electrode 25 is disposed between the light-emitting layer 240 and the colored layer 5. The common electrode 25 has light light-reflectivity and light-transparency. Further, the common electrode 25 is electrically conductive. The common electrode 25 is formed of alloy including Ag, for example MgAg.

In the light-emitting unit 2 described above, the light-emitting element 20R includes the reflective section 261, the insulating layer 21, the first insulating film 221, the second insulating film 222, the element separation layer 220, the pixel electrode 23R, the organic layer 24, and the common electrode 25. The light-emitting element 20G1 includes the reflective section 261, the insulating layer 21, the second insulating film 222, the element separation layer 220, the pixel electrode 23G1, the organic layer 24, and the common electrode 25. The light-emitting element 20G2 includes the reflective section 261, the insulating layer 21, the second insulating film 222, the element separation layer 220, the pixel electrode 23G2, the organic layer 24, and the common electrode 25. The light-emitting element 20B includes the reflective section 261, the insulating layer 21, the element separation layer 220, the pixel electrode 23B, the organic layer 24, and the common electrode 25.

Further, each light-emitting element 20 includes light resonance structure 29 that resonates light in a predetermined wavelength region between the reflective layer 26 and the common electrode 25. The light resonance structure 29 will be described later.

The sealing layer 4 is disposed on the plurality of light-emitting elements 20. The sealing layer 4 protects the plurality of light-emitting elements 20. Specifically, the sealing layer 4 is a sealing layer that seals the plurality of light-emitting elements 20 to protect the plurality of light-emitting elements 20 from an outside. The sealing layer 4 has gas barrier properties, and protects each light-emitting element 20 from external moisture, oxygen, or the like, for example. By providing the sealing layer 4, deterioration of the light-emitting element 20 can be suppressed compared to a case where the sealing layer 4 is not provided. Therefore, quality reliability of the electro-optical device 100 can be increased. Furthermore, the sealing layer 4 has light-transparency.

The sealing layer 4 includes a first sealing layer 41, the second sealing layer 42, and a third sealing layer 43. The first sealing layer 41, the second sealing layer 42, and the third sealing layer 43 are stacked in this order in a direction away from the substrate 10. The first sealing layer 41, the second sealing layer 42, and the third sealing layer 43 have light-transparency and insulating properties. A material of each of the first sealing layer 41 and the third sealing layer 43 is, for example, an inorganic compound such as silicon oxynitride (SiON). The second sealing layer 42 is a flattened layer for providing a flat surface to the third sealing layer 43. A material of the second sealing layer 42 is, for example, resin such as an epoxy resin or an inorganic compound. Note that, the sealing layer 4 has the three layers, but may have one, two, or four or more layers.

The first layer 81 is disposed on the sealing layer 4. The first layer 81 has light-transparency and insulating properties. The first layer 81 has a plurality of recessed portions 811. The recessed portion 811 is disposed corresponding to the pixel P. Specifically, in the present exemplary embodiment, the recessed portion 811 is disposed for each light-emitting element 20 included in the pixel P.

The second layer 82 is disposed on the first layer 81. The second layer 82 has light-transparency and insulating properties. The second layer 82 is a layer having a plurality of lens sections 821. The plurality of lens sections 821 are disposed on the plurality of recessed portions 811 in a one-to-one manner. Each lens section 821 is a protruding portion that protrudes in the Z2 direction from the colored layer 5. Each lens section 821 has a curved surface that contacts a surface of the recessed portion 811 and overhangs the common electrode 25 side. The curved surface functions as a lens surface. Further, the curved surface protrudes toward the common electrode 25. Light emitted from the light-emitting layer 240 is incident on such a lens section 821.

As illustrated in FIG. 3, the lens section 821 is disposed corresponding to the sub-pixel P0. In the present exemplary embodiment, the disposition is performed for each light-emitting element 20 included in the sub-pixel P0. Specifically, each lens section 821 overlaps the light-emitting element 20 in plan view. Each lens section 821 transmits light emitted from the corresponding light-emitting element 20. Note that, the two lens sections 821 are provided in the sub-pixel PG, but only one lens section 821 may also be provided. In this case, the one lens section 821 overlaps the light-emitting elements 20G1 and 20G2 in plan view.

A material of the first layer 81 and a material of the second layer 82 are different from each other. It is sufficient that each material has light-transparency, and an inorganic material such as silicon oxide or a resin material is used, for example. A refractive index of the first layer 81 is higher than a refractive index of the second layer 82. Thus, light transmitted through the lens section 821 is refracted so as to be focused at a lens surface of the lens section 821. Since the lens section 821 is included, light emitted from the light-emitting element 20 in the Z1 direction while spreading can be focused. Thus, light extraction efficiency can be improved compared to a case in which the lens section 821 is not included.

Note that, although the first layer 81 is present in the present exemplary embodiment, the first layer 81 may be omitted. In this case, a recessed portion for forming the lens section 821 is formed in the sealing layer 4. However, since the first layer 81 is present, no recessed portion needs to be formed in the sealing layer 4. Thus, a decrease in sealing performance of the sealing layer 4 due to formation of a recessed portion is suppressed.

As illustrated in FIG. 4 and FIG. 5, the colored layer 5 is disposed on the second layer 82. The colored layer 5 is a color filter that selectively transmits light in a predetermined wavelength region. The predetermined wavelength region includes a peak wavelength AO for each color. Since the colored layer 5 is included, color purity of light emitted from each sub-pixel P0 can be increased, compared to a case where the colored layer 5 is not included. The colored layer 5 is formed of a resin material such as an acrylic photosensitive resin material containing a color material, for example. The color material is pigment or dye.

The colored layer 5 includes a colored portion 50R provided corresponding to the sub-pixel PR, a colored portion 50B provided corresponding to the sub-pixel PB, and a colored portion 50G provided corresponding to the sub-pixel PG. The colored portion 50 is provided for each sub-pixel P0. The colored portion 50R is a color filter that selectively transmits light in the red wavelength region of light from the light-emitting element 20R. The colored portion 50B is a color filter that selectively transmits light in the blue wavelength region of light from the light-emitting element 20B. The colored portion 50G is a color filter that selectively transmits light in the green wavelength region of light from the light-emitting elements 20G1 and 20G2.

The colored portions 50R, 50G, and 50B have respective portions that overlap each other in plan view. That is, a portion exists where the colored portions 50 of three colors overlap in plan view. Furthermore, the colored portions 50R and 50B have respective portions that overlap each other in plan view. Similarly, the colored portions 50B and 50G have respective portions that overlap each other in plan view. In addition, the colored portions 50G and 50R have respective portions that overlap each other in plan view. Note that, the plurality of colored portions 50 need not overlap with each other.

The transmissive substrate 7 is bonded on the element substrate 1 via the adhesive layer 70. The adhesive layer 70 is a transparent adhesive in which resin materials such as an epoxy resin and an acrylic resin are used, for example.

1A-3. Light Resonance Structure

As described above, each light-emitting element 20 has the light resonance structure 29 that resonates light in a predetermined wavelength region between the reflective layer 26 and the common electrode 25. The light resonance structure 29 causes light emitted by the light-emitting layer 240 included in the organic layer 24 to be multiply reflected between the reflective layer 26 and the common electrode 25, and selectively enhances light in a predetermined wavelength region.

In the present exemplary embodiment, the light-emitting elements 20R, 20G, and 20B are different from each other in the light resonance structure 29. The light-emitting element 20R has light resonance structure 29R that enhances light in the red wavelength region between the reflective layer 26 and the common electrode 25. The light-emitting element 20G has light resonance structure 29G that enhances light in the green wavelength region between the reflective layer 26 and the common electrode 25. The light-emitting element 20B has light resonance structure 29B that enhances light in the blue wavelength region between the reflective layer 26 and the common electrode 25. As a result, light in a desired wavelength region can be enhanced and emitted outside for each sub-pixel P0 due to an optical resonance effect.

A resonance wavelength in the light resonance structure 29 is determined by the optical distance L0 between the reflective layer 26 and the common electrode 25. The optical distance L0 is determined by a product of a distance between a surface of the reflective layer 26 on a side opposite to the substrate 10 and a surface of the common electrode 25 on the sealing layer 4 side, and a refractive index therebetween.

In the present exemplary embodiment, the optical distance L0 is adjusted for each color. Thus, the optical distance L0 is different for each sub-pixel P0. Specifically, the optical distance L0 for the sub-pixel PR is set so as to correspond to the red wavelength region. The optical distance L0 for the sub-pixel PG is set so as to correspond to the green wavelength region. The optical distance L0 for the sub-pixel PB is set so as to correspond to the blue wavelength region.

For example, by changing a thickness of the light-transmitting layer 22, the optical distance L0 is adjusted. In this case, the light-transmitting layer 22 functions as a light path adjustment layer. In addition, in this case, the thickness of the light-transmitting layers 22 increases in an ascending order for the sub-pixel PR, the sub-pixel PG, and the sub-pixel PB. Note that, the method of adjusting the optical distance L0 is not limited to the method of adjusting by the thickness of the light-transmitting layer 22. For example, the optical distance L0 may be adjusted by changing a thickness of the pixel electrode 23 for each of the sub-pixels Pb, PG, and PR. Further, for example, the optical distance L0 may be adjusted by changing a refractive index for each of the sub-pixels PB, PG, and PR. Alternatively, a thickness of the organic layer 24 may be changed for each of the sub-pixels PB, PG, and PR, or the thickness of the pixel electrode 23 may be changed.

The optical distance L0 is set to be greater than an optical distance when intensity of light traveling in the Z1 direction is maximized. Note that, the optical distance when the intensity of light traveling in the Z1 direction is maximized is referred to as a reference optical distance Lp1. Further, the reference optical distance Lp1 is different for each color.

Specifically, the optical distance L0 satisfies (Formula 1) below, where a peak wavelength of a light emission spectrum of the light-emitting layer 240 is $\lambda$, and a natural number is m.

$$L0 > (m + \tfrac{1}{2})\lambda/2 \quad \text{(Formula 1)}$$

Note that, the natural number includes 0 (zero).

When the optical distance L0 satisfies (Formula 1) above, intensity of light traveling in a direction inclined with respect to the Z1 direction becomes greater than the intensity of light traveling in the Z1 direction. Note that, in (Formula 1), A is different for each color.

Figure 6:
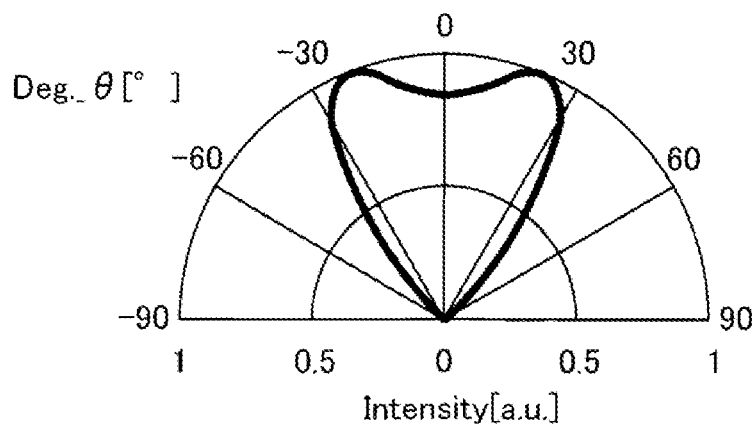
FIG. 6 is a diagram illustrating orientation characteristics of a light-emitting element included in the electro-optical device illustrated in FIG. 1.

FIG. 6 is a diagram illustrating orientation characteristics of the light-emitting element 20 included in the electro-optical device 100 illustrated in FIG. 1. When the optical distance L0 satisfies (Formula 1), the electro-optical device 100 shows the orientation characteristics as illustrated in FIG. 6. An angle illustrated in FIG. 6 is an angle with respect to a normal line direction of a display surface, that is, the Z1 direction. In the example illustrated in FIG. 6, intensity of light at an angle of 20° is greater than intensity of light at an angle of 0°. In other words, the intensity of light traveling in the direction inclined with respect to the Z1 direction becomes greater than the intensity of light traveling in the Z1 direction.

Figure 7:
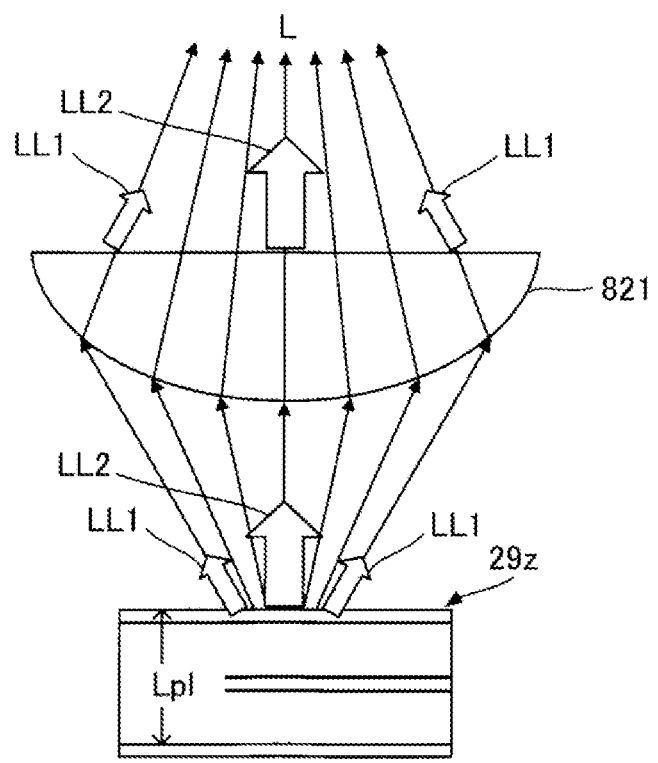
FIG. 7 is a diagram for describing intensity of light when light resonance structure having a reference optical distance is used.
Figure 8:
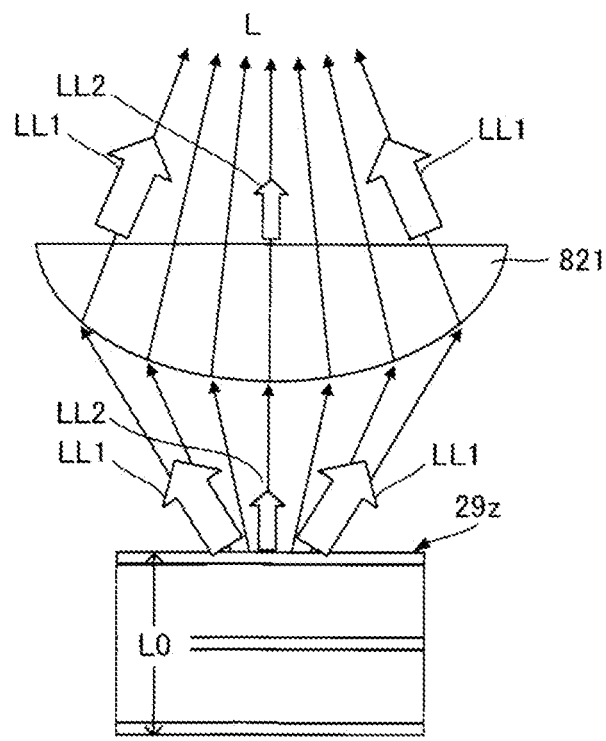
FIG. 8 is a diagram for describing intensity of light when light resonance structure having an optical distance according to the first exemplary embodiment is used.

FIG. 7 is a diagram for describing intensity of light when light resonance structure 29z having the reference optical distance LP1 is used. FIG. 8 is a diagram for describing intensity of light when the light resonance structure 29 having the optical distance L0 according to the first exemplary embodiment is used.

The light resonance structure 29z illustrated in FIG. 7 has the reference optical distance Lp1. As illustrated in FIG. 7, when the light resonance structure 29z is used, intensity of second light LL2 traveling in the Z1 direction of light L emitted from the light-emitting element 20 becomes greater than intensity of first light LL1 traveling in a direction inclined with respect to the Z1 direction. Then, when the lens section 821 is used for the light resonance structure 29z, the second light LL2 passes through a center of the lens section 821, and the first light LL1 passes through an end portion side of the lens section 821. The intensity of the second light LL2 transmitted through the lens section 821 becomes greater than the intensity of the first light LL1. Note that, the end portion of the lens section 821 is a region from a position at half a distance between the center and an edge of the lens section 821 to the edge.

The light resonance structure 29 of the present exemplary embodiment illustrated in FIG. 8 has the optical distance L0. As illustrated in FIG. 8, when the light resonance structure 29 of the present exemplary embodiment is used, the intensity of the first light LL1 traveling in the direction inclined with respect to the Z1 direction of the light L emitted from the light-emitting element 20 becomes greater than the intensity of the second light LL2 traveling in the Z1 direction. Then, the intensity of the first light LL1 transmitted through the lens section 821 becomes greater than the intensity of the second light LL2.

Figure 9:
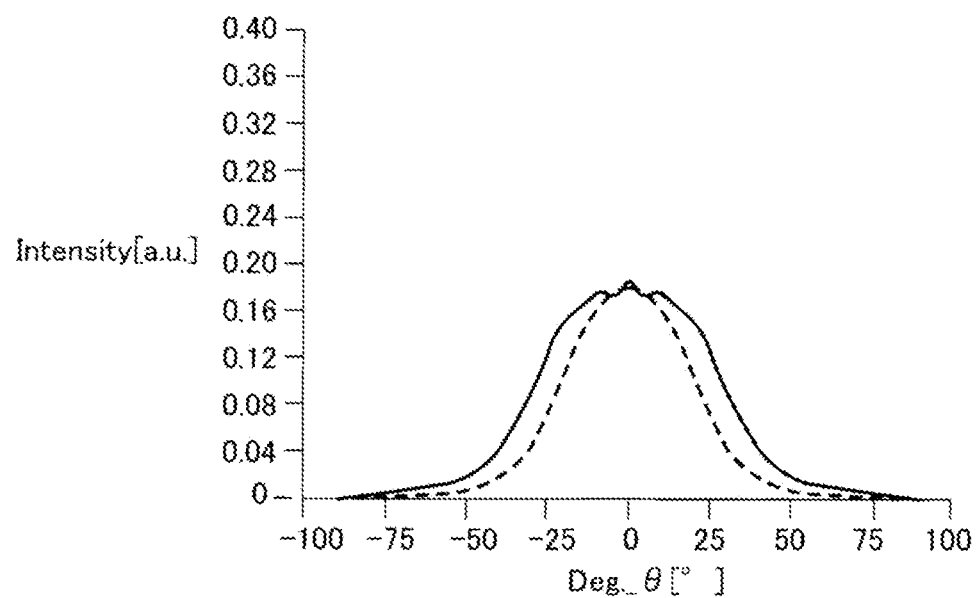
FIG. 9 includes simulation results showing a relationship between angle and intensity of light emitted from the electro-optical device.

FIG. 9 includes simulation results showing a relationship between angle and intensity of light emitted from the electro-optical device 100. A dashed line in FIG. 9 is a result of a case where the light resonance structure 29z having the reference optical distance of Lp1 is used. A solid line in FIG. 9 is a result of a case where the light resonance structure 29 having the optical distance L0 of the present exemplary embodiment is used. As shown in FIG. 9, when the light resonance structure 29 and the lens section 821 of the present exemplary embodiment are used, intensity of light can be enhanced in a wide angular range, compared to the case where the optical resonance structure 29z and the lens section 821 are used.

As described above, since the optical distance L0 satisfies (Formula 1), the intensity of light traveling in the direction inclined with respect to the Z1 direction becomes greater than the intensity of light traveling in the Z1 direction. Thus, as shown in FIG. 9, by using the light-emitting element 20 having the light resonance structure 29 of the present exemplary embodiment, and the lens section 821, it is possible to improve the light extraction efficiency in the electro-optical device 100.

Note that, the optical distance L0 of the light resonance structure 29 with respect to a wavelength region of a certain color is less than an optical distance with respect to a peak wavelength of a light emission spectrum in a wavelength region that is longer than the wavelength region of the certain color. Specifically, the optical distance L0 of the light resonance structure 29B is less than an optical distance corresponding to a peak wavelength of a light emission spectrum in the green wavelength region. The optical distance L0 of the light resonance structure 29B may be less than half a difference between the optical distance corresponding to the peak wavelength of the light emission spectrum in the green wavelength region and an optical distance corresponding to a peak wavelength of a light emission spectrum in the blue wavelength region.

Specifically, the optical distance L0 may satisfy (Formula 2) below, where the peak wavelength of the light emission spectrum of the light-emitting layer 240 is λ, a peak wavelength of a light emission spectrum in a wavelength region longer than λ is λ', and the natural number is m.

$$[\{(m+½)λ'\}/2 - \{(m+½)λ\}/2]/2 > L0 \qquad \text{(Formula 2)}$$

Note that, the natural number includes 0 (zero).

When the optical distance L0 satisfies (Formula 2), the light extraction efficiency in the electro-optical device 100 can be improved while an excessive color shift is prevented, compared to a case where (Formula 2) is not satisfied.

Additionally, as described above, the first light LL1 passes closer to the end portion side than the center of the lens section 821. Thus, intensity of light passing through a position closer to an end than the center of the lens section 821 becomes greater than intensity of light passing through the center of the lens section 821. Then, the first light LL1 is emitted from the electro-optical device 100 so as to be focused by an action of the lens section 821. Thus, the light extraction efficiency in the electro-optical device 100 can be improved, compared to a case where the first light LL1 passes through a position near the center of the lens section 821.

In particular, the optical distance L0 is set so that light traveling in a direction inclined with respect to the Z1 direction passes through the end portion of the lens section 821. As a result, the light extraction efficiency can be particularly improved. In other words, the optical distance L0 is set so that a peak wavelength of light to be desirably extracted at the end portion of the lens section 821 is maximized. As a result, the light extraction efficiency can be particularly improved.

Furthermore, a value of m in (Formula 1) above is 1. That is, resonance due to the light resonance structure 29 is primary resonance. Since the resonance is the primary resonance, color purity can be increased and light utilization efficiency can be increased, compared to, for example, a case where the resonance is zeroth-order resonance. In addition, since the color purity and the light utilization efficiency are high, a thickness of a color filter can be reduced, and a ratio of mixed colors is decreased, so an opening ratio can be improved.

Additionally, as described above, the colored layer 5 is disposed on the lens section 821. Specifically, the colored layer 5 is disposed on an opposite side of the lens section 821 to the common electrode 25. Thus, a distance between the light-emitting element 20 and the lens section 821 can be easily reduced, compared to a case where the lens section 821 is disposed on the colored layer 5. Thus, a ratio of light of the first light LL1 that does not pass through the lens section 821 can be reduced. Thus, the light extraction efficiency can be increased, compared to the case where the lens section 821 is disposed on the colored layer 5, for example.

Figure 10:
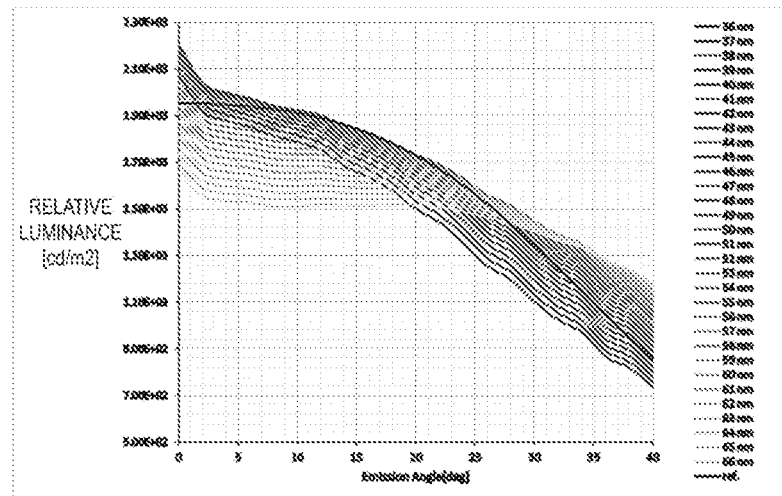
FIG. 10 includes simulation results showing green light intensity when optical distance is changed.

FIG. 10 includes simulation results showing intensity of green light emitted from the electro-optical device 100, when the optical distance L0 is changed. "ref" in FIG. 10 is a result when the lens section 821 is not included, and the light resonance structure 29z having the reference optical distance Lp1 is used. In FIG. 10, a relationship between relative luminance and angle is shown when the optical distance L0 is increased with respect to the reference optical distance Lp1. Specifically, each result is shown when a thickness of the light-transmitting layer 22 corresponding to the reference optical distance Lp1 is 36 nm, and a thickness of the transmitting layer 22 corresponding to the optical distance L0 is increased by a step of 1 mm within a range from 36 nm to 66 nm, which is the thickness of the transmitting layer 22 corresponding to the reference optical distance Lp1.

As illustrated in FIG. 10, by making the optical distance L0 greater than the reference optical distance Lp1 within a predetermined range, intensity of light can be enhanced at from 0° to 12°. Note that, the results when the primary resonance is caused are shown in FIG. 10. In addition, in FIG. 10, the results when the lens section 821 is used are shown.

Figure 11:
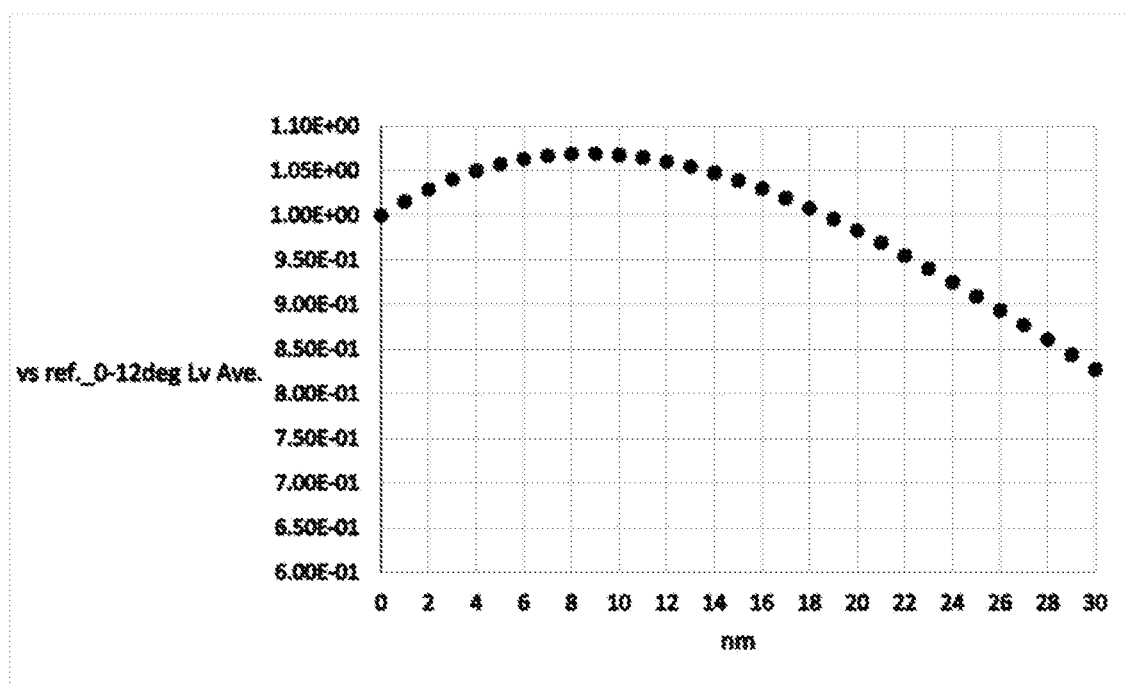
FIG. 11 is a simulation result showing green light intensity when thickness of a light-transmitting layer is changed.
Figure 12:
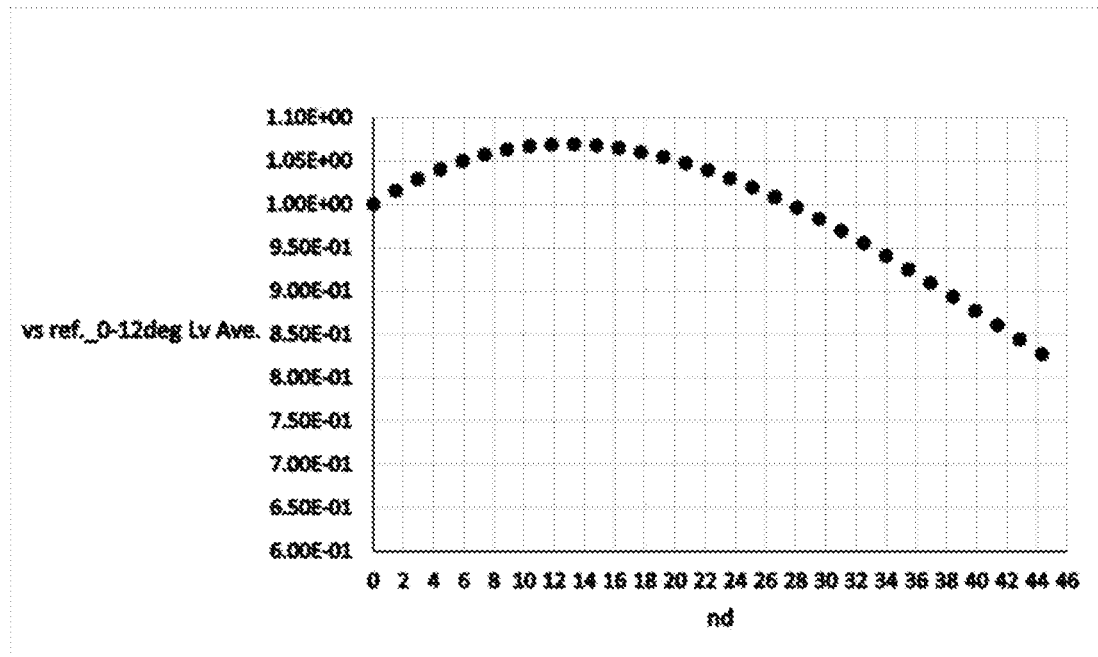
FIG. 12 is a simulation result showing green light intensity when optical path length of the light-transmitting layer changes in accordance with the change in thickness shown in FIG. 11.

FIG. 11 is a simulation result showing green light intensity when the thickness of the light-transmitting layer 22 is changed. FIG. 12 is a simulation result showing green light intensity when an optical path length of the light-transmitting layer 22 is changed in accordance with the change in thickness shown in FIG. 11. Note that, FIG. 11 and FIG. 12 show results when the lens section 821 is used. Further, the optical path length of the light-transmitting layer 22 is synonymous with the optical distance of the light-transmitting layer 22.

In FIG. 11, an average value of intensity of light at from 0° to 12° with respect to the thickness of the light-transmitting layer 22 is shown. Note that, in FIG. 11, the thickness of the light-transmitting layer 22 in the case of the reference optical distance Lp1 is set to 0 nm. A horizontal axis in FIG. 11 indicates increment in the thickness of the light-transmitting layer 22 with respect to the thickness of the light-transmitting layer 22 in the case of the reference optical distance Lp1. Note that, there is no change in the light-emitting element 20 except that the thickness of the light-transmitting layer 22 is changed. Therefore, as illustrated in FIG. 12, the greater the thickness of the light-transmitting layer 22, the greater the optical path length of the light-transmitting layer 22. Note that, in FIG. 12, the optical path length of the light-transmitting layer 22 in the case of the reference optical distance Lp1 is 0. A horizontal axis in FIG. 12 indicates increment in the optical path length of the light-transmitting layer 22 with respect to the optical path length of the light-transmitting layer 22 in the case of the reference optical distance Lp1.

In FIG. 11 and FIG. 12, when the lens section 821 is provided, and in the case of the reference optical distance Lp1, intensity of light is 1. As shown in FIG. 11, when the increment of the thickness of the light-transmitting layer 22 is greater than 0 nm and 18 nm or less with respect to the thickness of the light-transmitting layer 22 in the case of the reference optical distance Lp1, the intensity of light increases. Additionally, as illustrated in FIG. 12, when the increment of the optical path length of the light-transmitting layer 22 is greater than 0 and 26.6 or less with respect to the optical path length of the light-transmitting layer 22 in the case of the reference optical distance Lp1, the intensity of light increases. As a result, it can be seen that the light extraction efficiency is improved by increasing the optical distance L0 with respect to the reference optical distance Lp1 within a predetermined range. In particular, it is possible to enhance the intensity of light when an angle with respect to a normal line direction of a display surface is at or near 0°.

Figure 13:
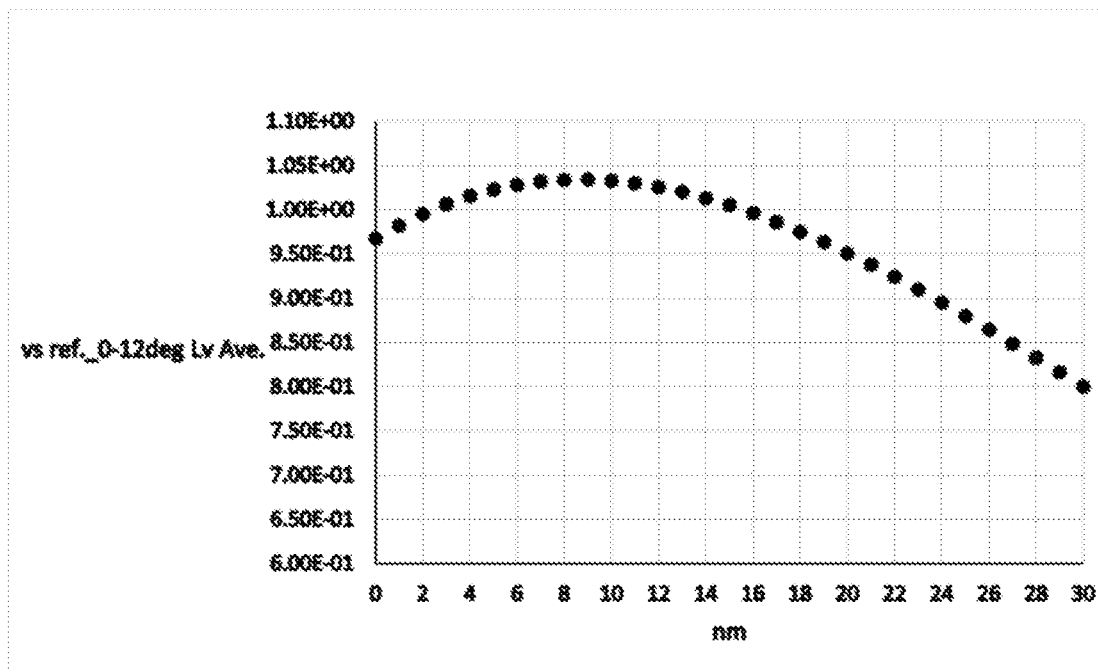
FIG. 13 is a simulation result showing green light intensity when a lens section is omitted.
Figure 14:
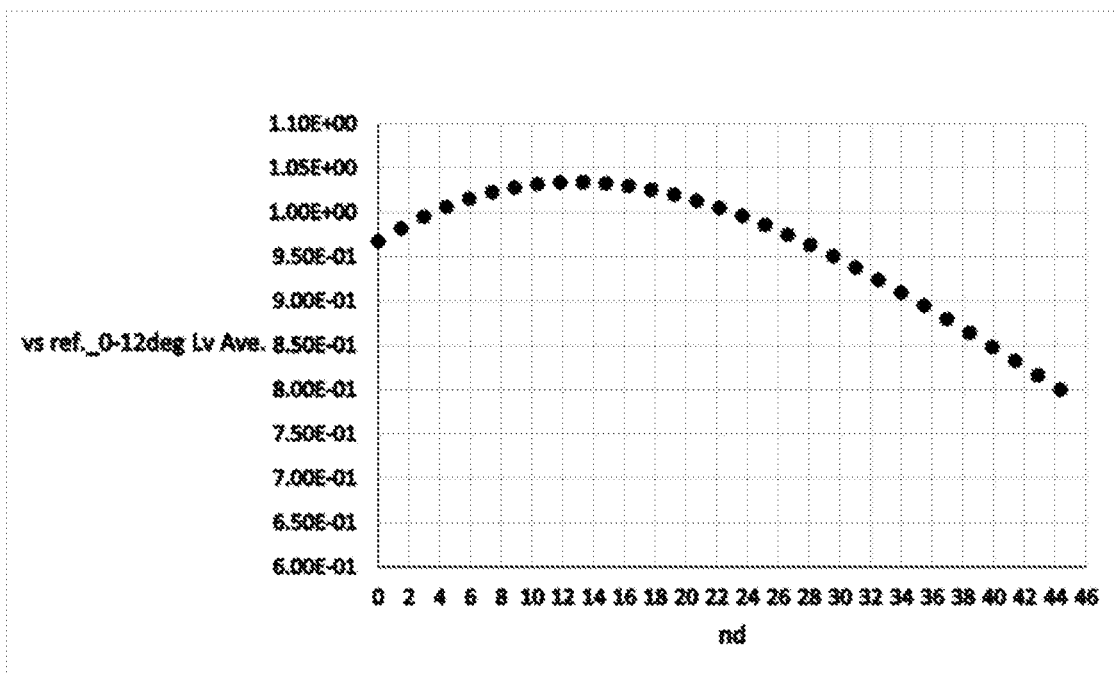
FIG. 14 is a simulation result showing green light intensity when the optical path length of the light-transmitting layer changes in accordance with the change in thickness shown in FIG. 13.

FIG. 13 is a simulation result showing green light intensity when the lens section 821 is omitted. Note that, in FIG. 13, conditions are the same as those illustrated in FIG. 11, except that the lens section 821 is omitted. Further, FIG. 14 is a simulation result showing green light intensity when an optical path length of the light-transmitting layer 22 is changed in accordance with the change in thickness shown in FIG. 13.

As shown in FIG. 13, when the lens section 821 is omitted, and the increment of the thickness of the light-transmitting layer 22 is from 3 nm to 15 nm with respect to the thickness of the light-transmitting layer 22 in the case of the reference optical distance Lp1, the intensity of light increases. Additionally, as shown in FIG. 14, when the lens section 821 is omitted, and the increment of the optical path length of the light-transmitting layer 22 is from 4.4 nm to 22.16 nm with respect to the optical path length of the light-transmitting layer 22 in the case of the reference optical distance Lp1, the intensity of light increases. Therefore, it can be seen that the light extraction efficiency is improved by using the lens section 821.

Note that, in FIG. 10 to FIG. 14, the examples in the case of green light have been described, but results showing the same trend were obtained for cases of blue light and red light. In addition, in FIG. 11 to FIG. 14, the examples have been described when the optical distance L0 is changed by changing the thickness of the light-transmitting layer 22. However, also when the optical distance L0 is changed by another method other than the method of changing the optical distance L0 by changing the thickness of the light-transmitting layer 22, the intensity of light increased similar to the case where the thickness of the light-transmitting layer 22 was changed. Thus, for example, even when the optical distance L0 is changed by changing a refractive index of the light-transmitting layer 22, a thickness of the common electrode 25, and the like, intensity of light increases.

As described above, according to the electro-optical device 100, since the light resonance structure 29 having the optical distance L0 and the lens section 821 that satisfy (Formula 1) are included, the light extraction efficiency emitted from the electro-optical device 100 can be improved compared to the related art.

Furthermore, a difference between the optical distance L0 and the reference optical distance LP1 may be in a rage greater than 0 and 45 or less. Within such a range, the light extraction efficiency can be increased in all the sub-pixels P0.

1B. Second Exemplary Embodiment

A second exemplary embodiment will be described. Note that, in each example below, a sign used in the description of the first exemplary embodiment is used for the same element as that of the first exemplary embodiment, and each detailed description thereof will be appropriately omitted.

Figure 15:
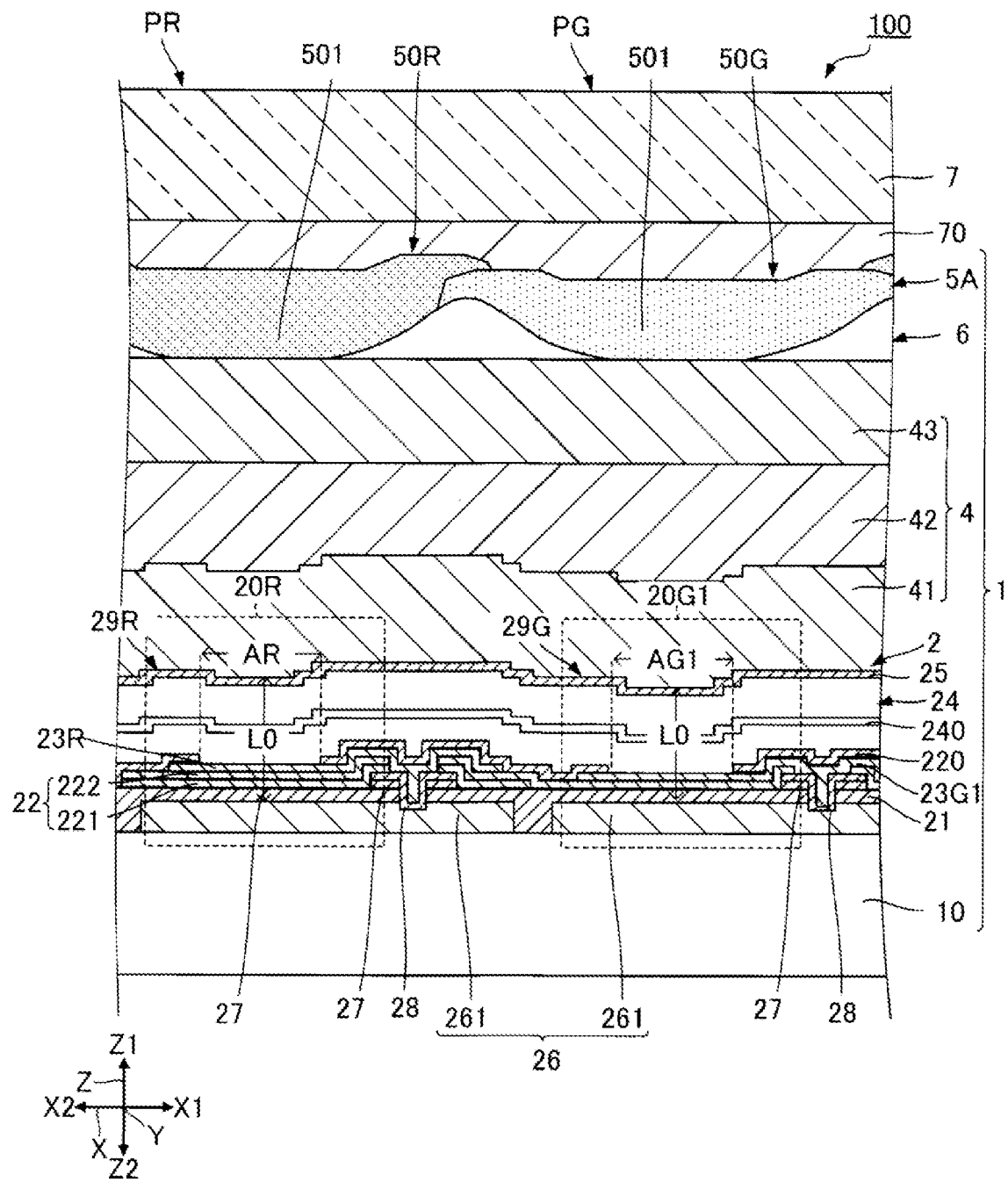
FIG. 15 is a cross-sectional view illustrating an electro-optical device according to a second exemplary embodiment.

FIG. 15 is a cross-sectional view illustrating the electro-optical device 100 according to the second exemplary embodiment. In the present exemplary embodiment, the first layer 81, the second layer 82, and the colored layer 5 are not included, and a wall portion 6 and a colored layer 5A are included.

The wall portion 6 illustrated in FIG. 15 is disposed between the light-emitting layer 240 and the colored layer 5. The wall portion 6 is provided to increase adhesion of the colored layer 5 to the element substrate 1. The wall portion 6 has light-transparency. The wall portion 6 is formed of, for example, a transparent resin material. Examples of the resin material include an epoxy resin, an acrylic resin, and the like, for example.

The wall portion 6 is mainly disposed between adjacent sub-pixels P0. Although not illustrated, the wall portion 6 is disposed so as to surround the sub-pixel P0 in plan view. As a result, the wall portion 6 functions as a wall-shaped member that partitions the sub-pixel P0. In addition, the wall portion 6 has an opening corresponding to each sub-pixel P0. The opening overlaps the light-emitting region A in plan view, although not illustrated.

The colored layer 5A is disposed so as to fill the opening of the wall portion 6, and cover the wall portion 6. Thus, the colored layer 5A contacts the wall portion 6 and the sealing layer 4. In addition, a maximum thickness of the colored layer 5 is greater than a maximum thickness of the wall portion 6. By the colored layer 5A covering the wall portion 6, leakage of light passing through the wall portion 6 can be suppressed.

Further, the colored layer 5A includes a plurality of lens sections 501. In other words, the lens section 501 is constituted by the colored layer 5A. The lens section 501 is mainly the same as the lens section 821 of the first exemplary embodiment, except for being an element included in the colored layer 5A. In the following description of the lens section 501, differences from the lens section 821 will be described, and similar items are omitted as appropriate.

The plurality of lens sections 501 are provided for each sub-pixels P0. Thus, each colored portion 50 included in the colored layer 5A has the lens section 501. The lens section 501 has a contact surface with the wall portion 6. The contact surface is a curved surface that protrudes toward the wall portion 6. The contact surface functions as a lens surface. A refractive index of each lens section 501 is higher than a refractive index of the wall portion 6. Thus, the lens section 501 focuses light emitted from the light-emitting element 20. Since the colored layer 5A includes the lens section 501, as in the first exemplary embodiment, a layer having the lens section 821 need not be provided separately from the colored layer 5. Further, in the present exemplary embodiment, by changing a thickness of the wall portion 6, for example, it is possible to easily form the lens section 501 having a lens surface with a desired curvature.

Also, although not illustrated, a part of the wall portion 6 overlaps the light-emitting region A in plan view. As a result, an area of the lens surface of the lens section 501 can be increased, compared to a case without the overlapping. Thus, an amount of light incident on the lens section 501 can be increased. For this reason, the light extraction efficiency can be further increased. Furthermore, although not illustrated, the wall portion 6 surrounds the light-emitting region A in plan view. Therefore, the light extraction efficiency can be increased, compared to a case without the surrounding. Note that, the wall portion 6 need not surround the light-emitting region A in plan view.

According to the above-described exemplary embodiment, the colored layer 5A includes the lens section 501. According to the present exemplary embodiment as well, the light extraction efficiency can be increased.

1C. Third Exemplary Embodiment

A third exemplary embodiment will be described. Note that, in each example below, a sign used in the description of the first exemplary embodiment is used for the same element as that of the first exemplary embodiment, and each detailed description thereof will be appropriately omitted.

Figure 16:
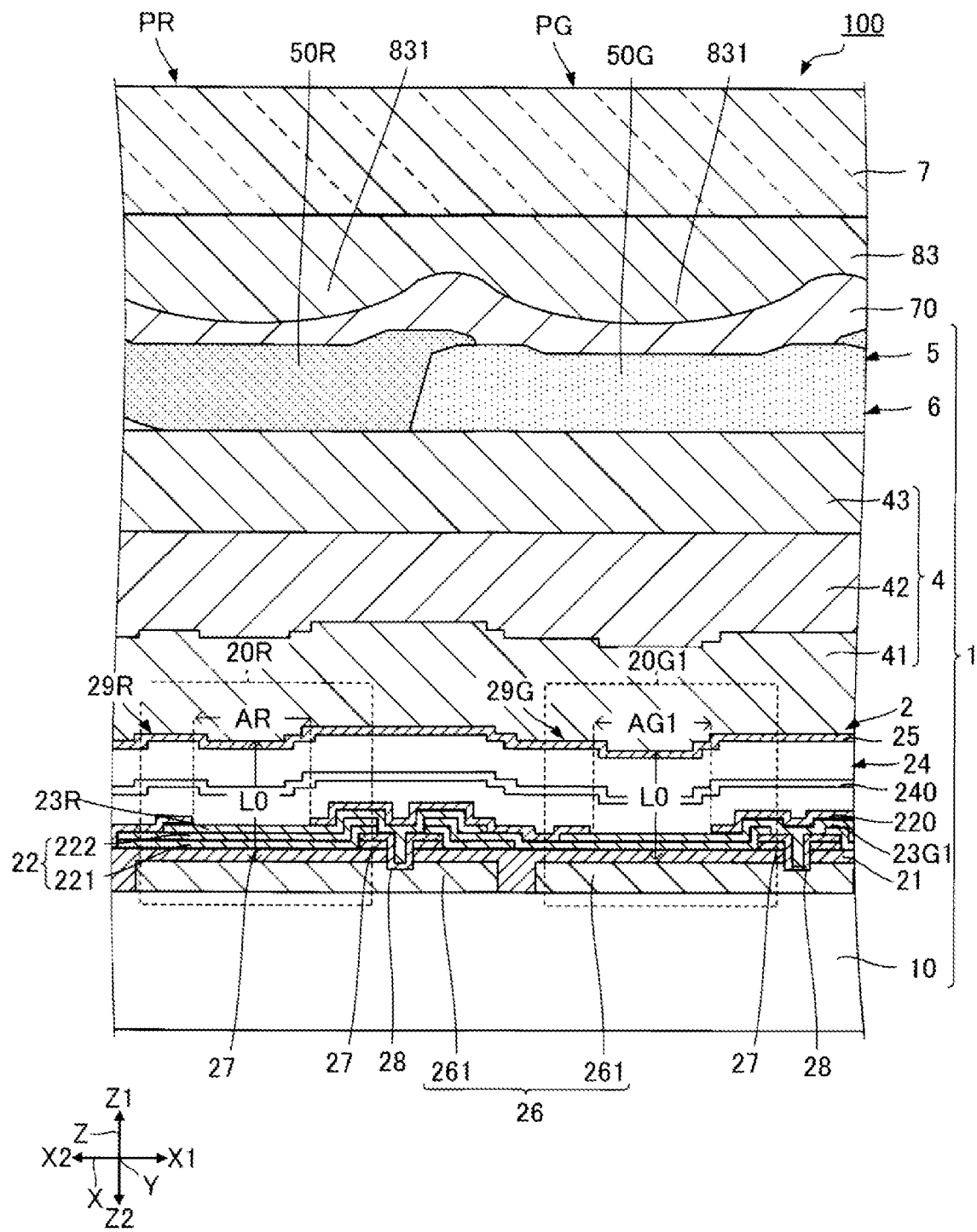
FIG. 16 is a cross-sectional view illustrating an electro-optical device according to a third exemplary embodiment.

FIG. 16 is a cross-sectional view illustrating the electro-optical device 100 according to the third exemplary embodiment. In the present exemplary embodiment, the first layer 81 and the second layer 82 are not provided, and a lens layer 83 is provided.

The lens layer 83 is disposed on an opposite side of the colored layer 5 to the light-emitting element 20. The lens layer 83 is disposed between the transmissive substrate 7 and the adhesive layer 70, and is in contact therewith. The lens layer 83 has a plurality of lens sections 831. The lens section 831 is the same as the lens sections 821 of the first exemplary embodiment, except for being an element included in the lens layer 83. In the following description of the lens section 831, differences from the lens section 821 will be described, and similar items are omitted as appropriate.

The lens section 831 has insulating properties and light-transparency. A refractive index of the lens section 831 is higher than a refractive index of the adhesive layer 70. Thus, the lens section 831 focuses light emitted from the light-emitting element 20. After being formed at the transmissive substrate 7, the lens layer 83 including such a lens section 831 is coupled to the element substrate 1 via the adhesive layer 70.

Light passing through the colored layer 5 passes through the lens section 831. Therefore, light with high color purity can be focused in comparison to the first exemplary embodiment. Thus, light extraction intensity and color purity can be increased.

1D. Modification Example

Each of the exemplary embodiments exemplified in the above can be variously modified. Specific modification aspects applied to each of the embodiments described above are exemplified below. Two or more modes freely selected from exemplifications below can be appropriately used in combination as long as mutual contradiction does not arise. Further, the following modified aspects of the first exemplary embodiment may be applied to the second and third exemplary embodiments as long as contradiction does not arise.

In the first exemplary embodiment, the lens section 821 is a protruding portion protruding in the Z2 direction, but the lens section 821 may be a protruding portion protruding in the Z1 direction. In this case, a refractive index of the first layer 81 is lower than a refractive index of the second layer 82.

In each exemplary embodiment, the light-emitting unit 2 has the different light resonance structure 29 for each sub-pixel P0. In other words, the light-emitting unit 2 has the different light resonance structure 29 for each color. However, the light-emitting unit 2 may have the same light resonance structure 29 for each color. In this case, for example, the optical distance L0 is set in accordance with a peak wavelength in one of red, blue, and green wavelength regions.

In each exemplary embodiment, the light resonance structure 29 has the optical distance L0 that satisfies (Formula 1) for each sub-pixel P0. However, the light resonance structure 29 provided in at least one of the sub-pixels PR, PB, and PG may have the optical distance L0 that satisfies (Formula 1). This case is effective when intensity of light of a particular color is to be enhanced.

In each exemplary embodiment, the pixel electrode 23 has light-transparency, while the pixel electrode 23 may have light light-reflectivity. In this case, the reflective layer 26 may be omitted. In addition, in this case, the pixel electrode 23 corresponds to a "reflective layer". In addition, although the common electrode 25 is common in the plurality of light-emitting elements 20, an individual cathode may be provided for each light-emitting element 20.

In each exemplary embodiment, the array of light-emitting regions A is the rectangular array, but is not limited thereto, and may be, for example, a Bayer array, a delta array, or a stripe array.

In the first exemplary embodiment, the shape of the light-emitting region A is octagonal, but is not limited thereto, and may have other shapes such as square and circular. However, when an octagonal shape or a circular shape is used, light can be efficiently transmitted to an end portion of the lens section 821 compared to a case where a rectangular shape is used. For this reason, the light extraction efficiency can be further increased.

The "electro-optical device" is not limited to an organic EL device, and may be an inorganic EL device where an inorganic material is used, or a µLED device.

2. Electronic Apparatus

The electro-optical device 100 of the above-described exemplary embodiments is applicable to various electronic apparatuses.

2-1. Head-Mounted DISPLAY

Figure 17:
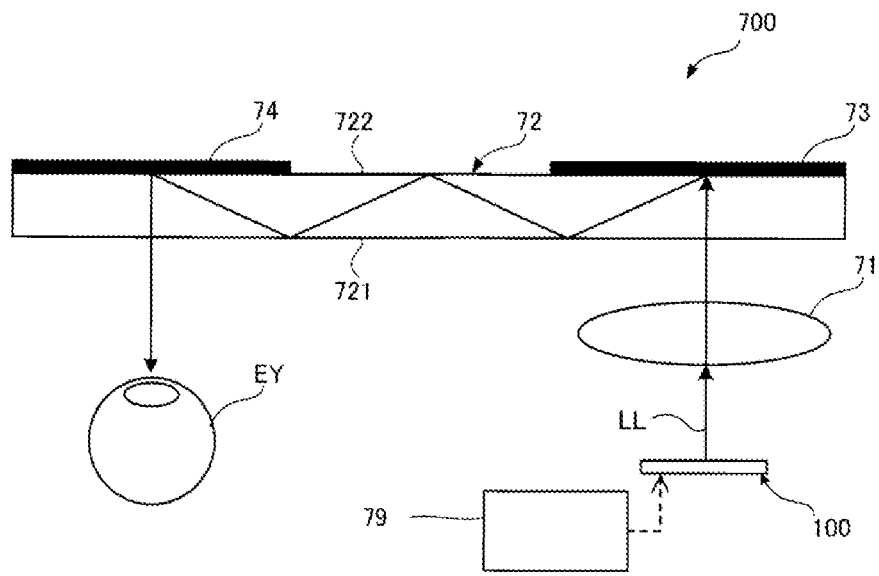
FIG. 17 is a plan view schematically illustrating a part of a virtual display apparatus as an example of an electronic apparatus.

FIG. 17 is a plan view schematically illustrating a part of a virtual display apparatus 700 as an example of an electronic apparatus. The virtual display apparatus 700 illustrated in FIG. 17 is a head-mounted display (HMD) mounted on a head of an observer and configured to display an image. The virtual display apparatus 700 includes the electro-optical device 100 described above, a collimator 71, a light guide 72, a first reflective-type volume hologram 73, a second reflective-type volume hologram 74, and a control unit 79. Note that, light emitted from the electro-optical device 100 is emitted as image light LL.

The control unit 79 includes a processor and a memory, for example, to control operation of the electro-optical device 100. The collimator 71 is disposed between the electro-optical device 100 and the light guide 72. The collimator 71 collimates light emitted from the electro-optical device 100. The collimator 71 is constituted of a collimating lens or the like. The light collimated by the collimator 71 is incident on the light guide 72.

The light guide 72 has a flat plate shape, and is disposed so as to extend in a direction intersecting a direction of light incident via the collimator 71. The light guide 72 reflects and guides light therein. A light incident port on which light is incident and a light emission port from which light is emitted are provided in a surface 721 of the light guide 72 facing the collimator 71. The first reflective-type volume hologram 73 as a diffractive optical element and the second reflective-type volume hologram 74 as a diffractive optical element are disposed on a surface 722 of the light guide 72 opposite to the surface 721. The second reflective-type volume hologram 74 is provided closer to the light emission port side than the first reflective-type volume hologram 73. The first reflective-type volume hologram 73 and the second reflective-type volume hologram 74 have interference fringes corresponding to a predetermined wavelength region, and diffract and reflect light in the predetermined wavelength region.

In the virtual display apparatus 700 having such a configuration, the image light LL incident on the light guide 72 from the light incident port travels while being repeatedly reflected, and is guided to an eye EY of the observer, and thus the observer can observe an image constituted of a virtual image formed by the image light LL.

The virtual display apparatus 700 includes the above-described electro-optical device 100. The above-described electro-optical device 100 has excellent light extraction efficiency and good quality. Thus, the virtual display apparatus 700, which is bright with high display quality, can be provided by including the electro-optical device 100.

2-2. Personal Computer

Figure 18:
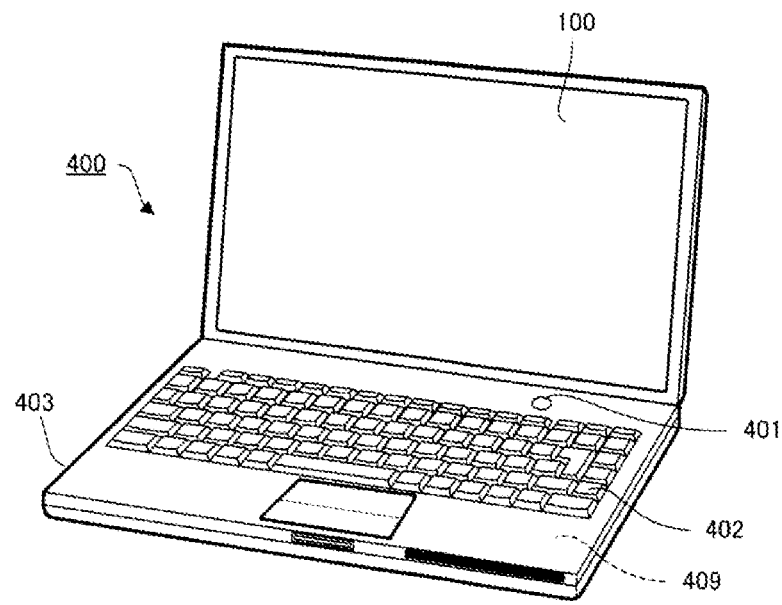
FIG. 18 is a perspective view illustrating a personal computer as an example of the electronic apparatus.

FIG. 18 is a perspective view illustrating a personal computer 400 as an example of the electronic apparatus in the present disclosure. The personal computer 400 illustrated in FIG. 18 includes the electro-optical device 100, a main body 403 provided with a power switch 401 and a keyboard 402, and a control unit 409. The control unit 409 includes a processor and a memory, for example, to control operation of the electro-optical device 100. In the personal computer 400, the electro-optical device 100 described above has excellent light extraction efficiency and good quality. Thus, since the electro-optical device 100 is provided, the personal computer 400, which is bright with high display quality can be provided.

Note that, examples of the "electronic apparatus" including the electro-optical device 100 include, in addition to the virtual display apparatus 700 illustrated in FIG. 17 and the personal computer 400 illustrated in FIG. 18, apparatuses arranged close to eyes such as a digital scope, a digital binocular, a digital still camera, and a video camera. Further, the "electronic apparatus" including the electro-optical device 100 is applied as a mobile phone, a smartphone, a Personal Digital Assistant (PDA), a car navigation device, and a vehicle-mounted display unit. Furthermore, the "electronic apparatus" including the electro-optical device 100 is applied as illumination for illuminating with light.

The present disclosure was described above based on the illustrated exemplary embodiments. However, the present disclosure is not limited thereto. In addition, the configuration of each component of the present disclosure may be replaced with any configuration that exerts the equivalent functions of the above-described exemplary embodiments, and to which any configuration may be added. Further, any configuration may be combined with each other in the above-described exemplary embodiments of the present disclosure.

What is claimed is:

1. An electro-optical device, comprising:
   a substrate;
   a semi-transmissive reflective layer having light-reflectivity and light-transparency;
   a reflective layer disposed between the substrate and the semi-transmissive reflective layer;
   a light-emitting layer disposed between the reflective layer and the semi-transmissive reflective layer; and
   a lens that is disposed corresponding to a pixel, and on which light emitted from the light-emitting layer is incident, wherein the electro-optical device satisfies:

$$L0 > (m+½)\lambda/2 \quad \text{(Formula 1)}$$

and $$[\{(m+½)\lambda'\}/2 - \{(m+½)\lambda\}/2]/2 > L0 \quad \text{(Formula 2)}$$

where an optical distance between the reflective layer and the semi-transmissive reflective layer is L0, a peak wavelength of a light emission spectrum of the light-emitting layer is $\lambda$, a peak wavelength of a light emission spectrum in a wavelength region longer than the peak wavelength of the light emission spectrum of the light-emitting layer is $\lambda'$, and a natural number is m.

2. The electro-optical device according to claim 1, wherein a value of m in (Formula 1) is 1.

3. The electro-optical device according to claim 1, further comprising:
   a colored layer disposed on a side of the lens opposite to the semi-transmissive reflective layer.

4. The electro-optical device according to claim 1, wherein the lens is formed of a colored layer.

5. An electronic apparatus, comprising:
   the electro-optical device according to claim 1; and
   a control unit configured to control operation of the electro-optical device.

* * * * *